United States Patent [19]

Kelley et al.

[11] 4,320,519

[45] Mar. 16, 1982

[54] (SIN X)/X CORRECTION CIRCUIT FOR A SAMPLED DATA SYSTEM

[75] Inventors: Stephen H. Kelley, Austin, Tex.; Henry Wurzburg, Tempe, Ariz.

[73] Assignee: Motorola, Inc., Schaumburg, Ill.

[21] Appl. No.: 138,969

[22] Filed: Apr. 10, 1980

[51] Int. Cl.³ .......................................... H03K 13/32
[52] U.S. Cl. ...................................... 375/26; 375/34; 375/60; 328/162
[58] Field of Search .................... 320/1; 307/109, 110, 307/108, 221 C, 221 D; 375/25, 26, 97, 103, 34.60; 328/149, 151, 165, 167, 162; 333/166, 167, 173, 165; 370/91, 118, 119; 364/485, 486, 487, 572, 724, 825, 844; 330/7, 9, 107, 109, 167, 173, 51

[56] References Cited

U.S. PATENT DOCUMENTS 3,649,924  3/1972  Lucas ..................................... 330/51
4,179,665 12/1979  Gregorian ............................ 330/107
4,229,703 10/1980  Bustin .................................... 330/9

OTHER PUBLICATIONS

Herbert Taub & Donald Schilling, Principles of Communication Systems, 1971, pp. 7, 8, 168-174 (McGraw-Hill Book Company).
Member of Technical Staff of Bell Telephone Laboratories, Transmission Systems for Communications, 1970, pp. 566-570.
Gray, Senderowicz, Ohara, Warren, "A Single-Chip NMOS Dual Channel Filter for PCM Telephony Applications, Dec. 1979, vol. SC-14, p. 986.
Gregorian, Nicholson, Journal of Solid-State Circuits, Dec. 1979, vol. SC-14, No. 6, 1979, p. 974.
IEEE Journal of Solid-State Circuit, vol. SC-12, No. 6, Dec. 1977, by J. Terry Caves, Miles A. Copland, p. 592, "Sample Analog Filtering Using Switch Capacitor and as Resistor Equivalents".
IEEE Int-Solid State Circuit Conf., vol. XXII, No. (1979-02), by Gregoria, Haque, Mao, Blasio and Nicholson, Sessions II, Telecommunication Circuit Techniques Wamzl, "CMOS Switched-Capacitor Filter for a Two Chip PCM Voice Codex".

Primary Examiner—Benedict V. Safourek
Assistant Examiner—Stephen Chin
Attorney, Agent, or Firm—Anthony J. Sarli, Jr.; Jeffrey Van Myers; Robert L. King

[57] ABSTRACT

A sampled data system having improved (sin X)/X correction is provided. A modified switched capacitor filter is used as a receive filter. The switched capacitor filter is modified in a manner to provide a charge gain thereby avoiding the increase in thermal noise normally associated with voltage gain amplification. The modified switched capacitor filter does not impair the dynamic range of the system and can be made duty cycle independent by providing additional controllable switches to the filter.

8 Claims, 5 Drawing Figures

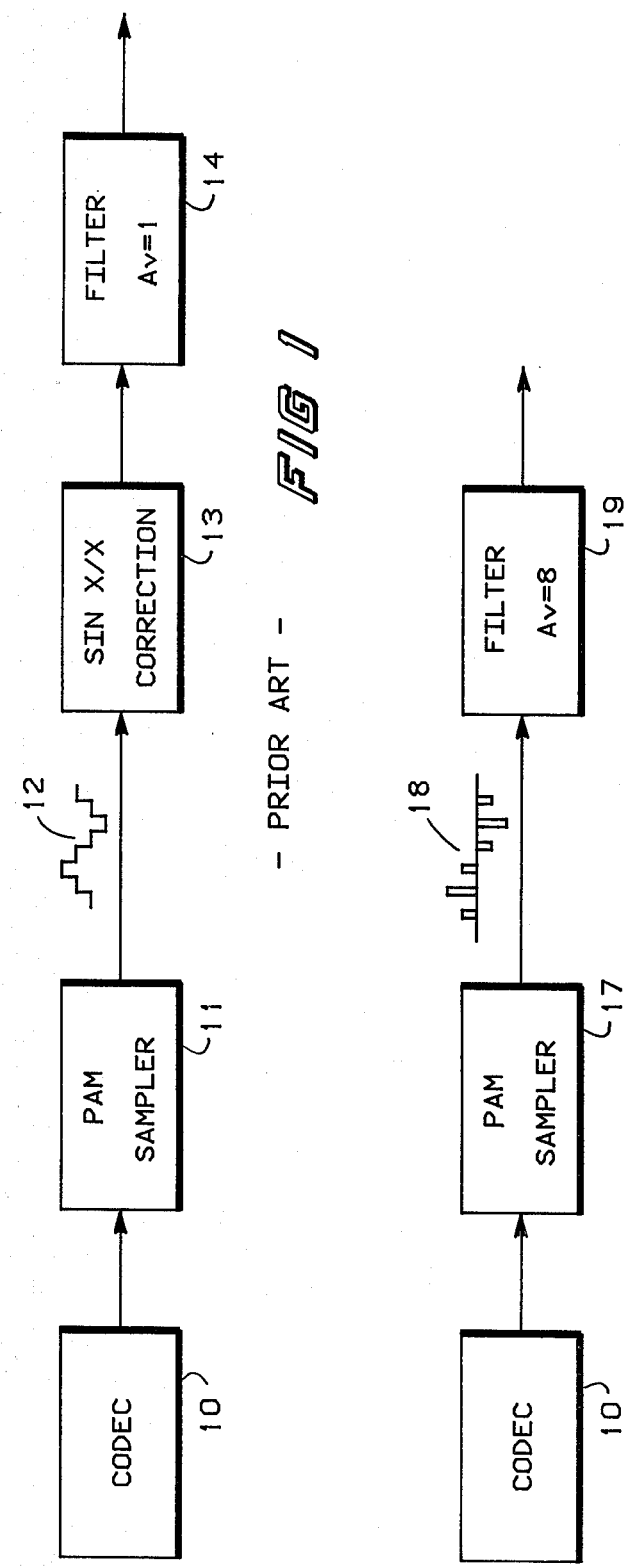

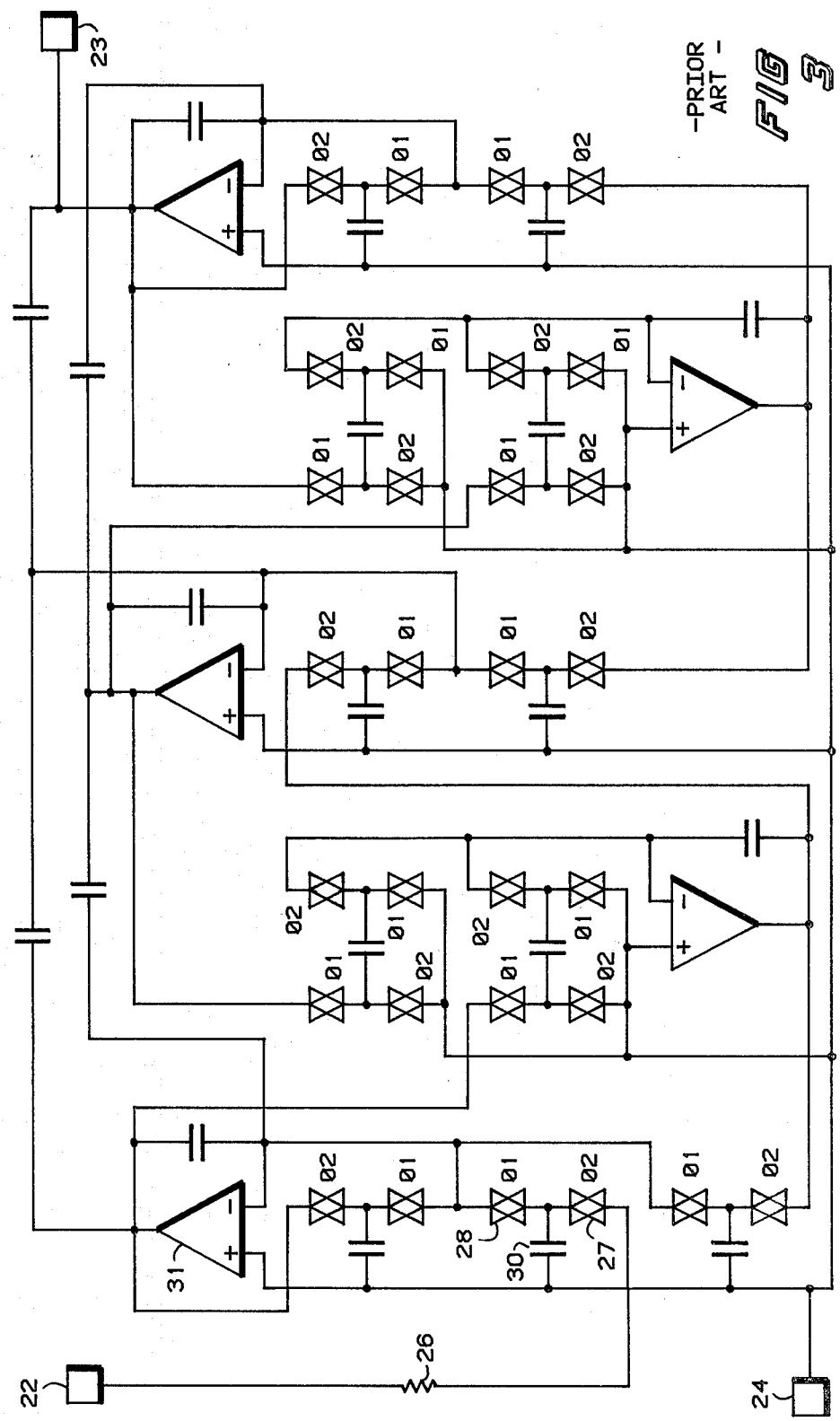

(SIN X)/X CORRECTION CIRCUIT FOR A SAMPLED DATA SYSTEM

This invention relates, in general, to sampled data systems, and more particularly, to a switched capacitor filter used as a receive filter in such a sampled data system.

A coder/decoder, commonly called a codec, is used in telecommunication systems. A codec is used to convert a signal, through an analog to digital conversion, to digital data and then to reconstitute the same signal by performing a digital to analog conversion of the digital data and passing the resulting signal through a receive filter. In a telecommunication system the frequency concerned with is generally from 300 Hertz to 3400 Hertz. The analog to digital conversion of the signal is accomplished by taking periodic samples of the signal. The periodic sampling of the signal is governed by the sampling theorem. Commonly, the sampling is done at an 8 KHz rate which means that at every 125 microseconds a point on the sinewave is sampled.

In the past, when the sampled data was received the samples were each held or stretched to provide an output that was 125 microseconds wide which resulted in what was commonly called a staircase output. This staircase output was then fed into a low pass filter to reproduce the original sinewave. However, there was a distortion that occurred which was called (sin X)/X distortion. The (sin X)/X distortion resulted from stretching the sampled impulses into the staircase waveform. This resulted in an effective droop in passband when processed through the receive lowpass filter. The droop in the frequency response is known as (sin X)/X distortion. To overcome the (sin X)/X distortion the staircase signal was processed through a low pass filter having a predistorted passband response which provided additional gain at the frequencies where the droop or (sin X)/X distortion occurred. The shortcomings of this solution was that the filter was very complex and difficult to design. In addition, the predistorted filter increased the overall signal processing delay and the filter was very component sensitive.

Another solution attempted in the past was to only hold or stretch the sampled impulse for a short period of time such as one-eighth of the normal time of 125 microseconds. This caused the (sin X)/X null to move out to 64 KHz which is eight times the sampling frequency. Therefore, the droop in frequency response of the filter occurring in the passband range is negligible. A shortcoming with this solution is that now the output pulse only has one-eighth the energy level of the staircase output provided by the previous method, and the signal out of the filter will only be one-eighth the amplitude of the original signal. The signal out of the filter could be amplified by a factor of eight but then this results in approximately an 18 db noise floor degradation. Some PCM systems cannot tolerate this noise floor degradation. As an example, in telephone systems, 90 db of dynamic range is required and when one-eighth PAM is used then the telephone system must have approximately 108 db of dynamic range. By now, it should be appreciated that it would be desirable to avoid the (sin X)/X distortion and yet not degrade the noise floor of the system.

Accordingly, it is an object of the present invention to provide a sampled data filter having (sin X)/X correction.

Another object of the present invention is to provide a PCM system having (sin X)/X correction which does not require the use of additional amplifiers or degrade the dynamic range of the system.

Yet another object of the present invention is to provide a (sin X)/X correction circuit which results in only a minimal increase in silicon area.

SUMMARY OF THE INVENTION

In carrying out the above and other objects of the invention in one form, there is provided (sin X)/X correction incorporated into a switched capacitor filter. The filter has additional gain to compensate for the loss incurred through the (sin X)/X reducing resampler without the use of an additional amplifier. The switched capacitor filter has an input capacitor in the first operational amplifier stage which provides the input term for the filter. It has been discovered that by increasing this input capacitor that a charge gain can be obtained that increases the filter gain without subsequent increase in system noise floor. The switched capacitor filter is useful in a PCM receive filter.

The subject matter which is regarded as the invention is set forth in the appended claims. The invention itself, however, together with further objects and advantages thereof, may be better understood by referring to the following detailed description taken in conjunction with the accompanying drawings.

BRIEF DESCRIPTION OF THE DRAWINGS

FIG. 1 illustrates in block diagram form a portion of a prior art codec system;

FIG. 2 illustrates in block diagram form a portion of a codec system incorporating the present invention;

FIG. 3 illustrates a prior art switched capacitor filter;

Figure 4:
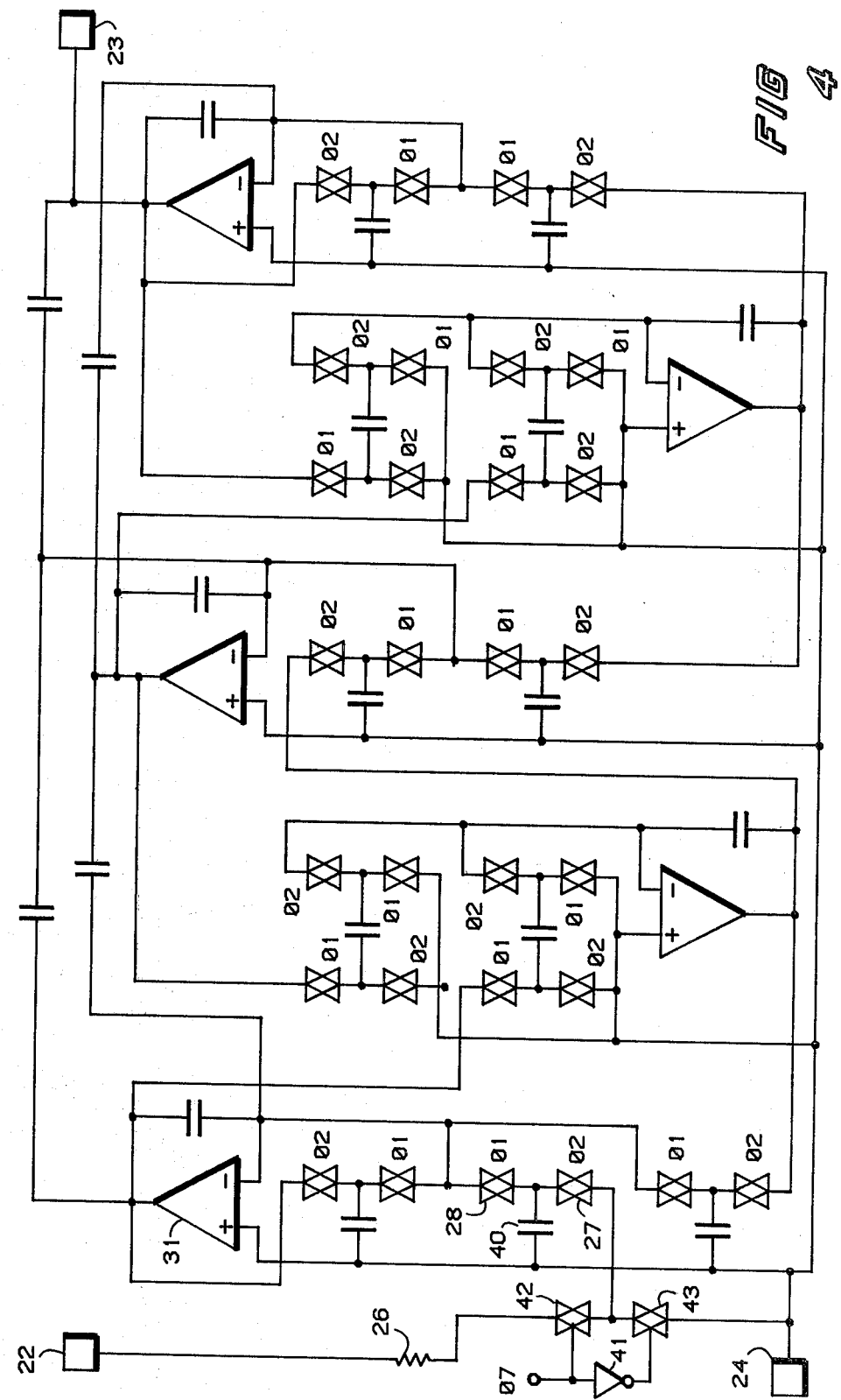
FIG. 4 illustrates, in one form thereof, the present invention incorporated into a switched capacitor filter.

The exemplification set out herein illustrates the preferred embodiment of the invention in one form thereof, and such exemplification is not to be construed as limiting in any matter.

DETAILED DESCRIPTION OF THE DRAWINGS

Pulse code modulation, PCM, systems have been around for sometime. A portion of such a system is illustrated in FIG. 1 having a codec 10, a pulse amplitude modulation (PAM) sampler 11, a (sin X)/X correction circuit 13, and a filter 14. Codec 10 is capable of encoding an analog signal and is also capable of decoding a digital signal to reproduce an equivalent analog signal. An example of a PCM codec which could be used for codec 10 is described in IEEE Journal of Solid-State Circuits, Vol. SC-14, No. 1, February 1979, by Steve Kelley and Dick Ulmer. The portion of the PCM system illustrated in FIG. 1 is concerned with a receive signal which is decoded by codec 10. The output of codec 10 is coupled to a PAM sampler 11 which produces an output staircase signal 12. Observation of staircase signal 12 indicates that PAM sampler 11 is a 100% PAM sampler. This means that each pulse received from codec 10 is stretched or held at an amplitude corresponding to the amplitude of the received pulse for the full time period of the sampling frequency. Correction circuitry 13 would commonly be an amplifier or could be incorporated into filter 14 to provide a distorted frequency response for filter 14 which would overcome the droop caused by the (sin X)/X problem resulting when signal 12 is processed by filter 14. In the case where PAM sampler 11 is not a 100% sampler but is some lower percentage, then correction circuitry 13 could be an amplifier to amplify the narrower pulses appearing at signal 12 so that the output of filter 14 would remain the same amplitude as when it is processing a 100% PAM sampled signal. Filter 14 has a voltage gain ($A_V$) of 1.

FIG. 2 illustrates in block diagram form codec 10 coupled to PAM sampler 17, wherein PAM sampler 17 provides an output signal 18. The width of the output pulses produced by PAM sampler 17 are less than the pulse width produced by PAM sampler 11 in FIG. 1 but yet are of a sufficient width to provide a filterable signal. Filter 19 illustrated in FIG. 2 has a gain of eight and is therefore capable of handling an input signal 18 having pulse widths one-eighth of the width of the signal 12 in FIG. 1. The manner in which the gain of filter 19 is increased to eight avoids using voltage amplification which would result in much greater background or thermal noise level.

FIG. 3 illustrates a prior art switched capacitor filter which is useful as a transmit filter for a PCM system but would suffer from (sin X)/X degradation as a PCM receive filter. The switched capacitor filter has an input terminal 22, an output terminal 23, and a reference or analog voltage terminal 24. An input received at input terminal 22 is coupled by an isolation resistor 26 to a controllable switch 27. When switch 27 is enabled and switch 28 is disabled the input signal will be applied across capacitor 30 thereby allowing capacitor 30 to charge up. When controllable switch 28 is enabled and switch 27 is disabled capacitor 30 will be connected to the inverting input of operational amplifier 31. The non-inverting input of operational amplifier 31 is connected to reference terminal 24. Capacitor 30, switches 27 and 28, and operational amplifier 31 in conjunction with the associated other capacitors produces what is commonly called the input term for the switched filter capacitor. The switched capacitor filter includes many controllable switches which are controlled by timing signals $\phi 1$ and $\phi 2$ plus several operational amplifiers and capacitors.

FIG. 4 shows a switched capacitor filter modified in a manner to overcome (sin X)/X distortion. Input terminal 22 is coupled by isolation resistor 26 to a controllable switch 42. Controllable switch 42 is controlled by a control signal $\phi 7$. $\phi 7$ is also coupled to an inverting circuit 41 which provides an output to control controllable switch 43. Controllable switch 43 is coupled from controllable switch 42 to reference terminal 24. The junction between switches 42 and 43 is coupled by controllable switch 27 to capacitor 40. Capacitor 40 is coupled by controllable switch 28 to the inverting input of operational amplifier 31. The switched capacitor filter provides an output at output terminal 23. It should be noted that three elements have been added to the switched capacitor filter of FIG. 3 to obtain the switched capacitor filter of FIG. 4. These three elements are controllable switches 42 and 43 and inverter 41. The purpose of inverter 41 is to provide a complementary signal from control signal $\phi 7$. If in the generation of control signal $\phi 7$ its complement is also provided then inverter 41 would not be necessary and control signal $\phi 7$ would only be coupled to controllable switch 42 while its complement would be coupled to controllable switch 43. The other modification to the switched capacitor filter is to increase the value of capacitor 40 from its value in the prior art circuit. Assuming that the input signal arriving at capacitor 40 is only one-eighth the width allowed by the sampling frequency then capacitor 40 would be eight times the capacitance of the input capacitor of the prior art switched capacitor filter. Capacitor 40 is called the input capacitor since it stores the received input signal and provides such signal to the first operational amplifier 31. It should be noted that if the input signal arriving at input terminal 22 is of the full width allowed by the sampling frequency, switch 42 can be controlled or enabled to provide the proper width signal to capacitor 40. If capacitor 40 is eight times the capacitance value of the capacitor in a prior art switched capacitor filter then a charge gain of 8 occurs on the input term to the filter. By making the capacitor larger, a larger charge can be stored thereon. Increasing the value of capacitor 40 instead of increasing the gain of one of the operational amplifier stages within the switched capacitor filter results in a much lower thermal noise base for the filter. Controllable switches 42 and 43 make the switched capacitor filter of FIG. 4 independent of duty cycle. Capacitor 40 can be chosen to be increased to a value corresponding to the reciprocal of the time duration of $\phi 7$ compared to the time duration permitted by the sampling frequency. This permits a narrow resampling of the signal to substantially eliminate (sin X)/X distortion without degrading the noise floor of the invention. Therefore this technique does not sacrifice the dynamic range of the system.

Figure 5:
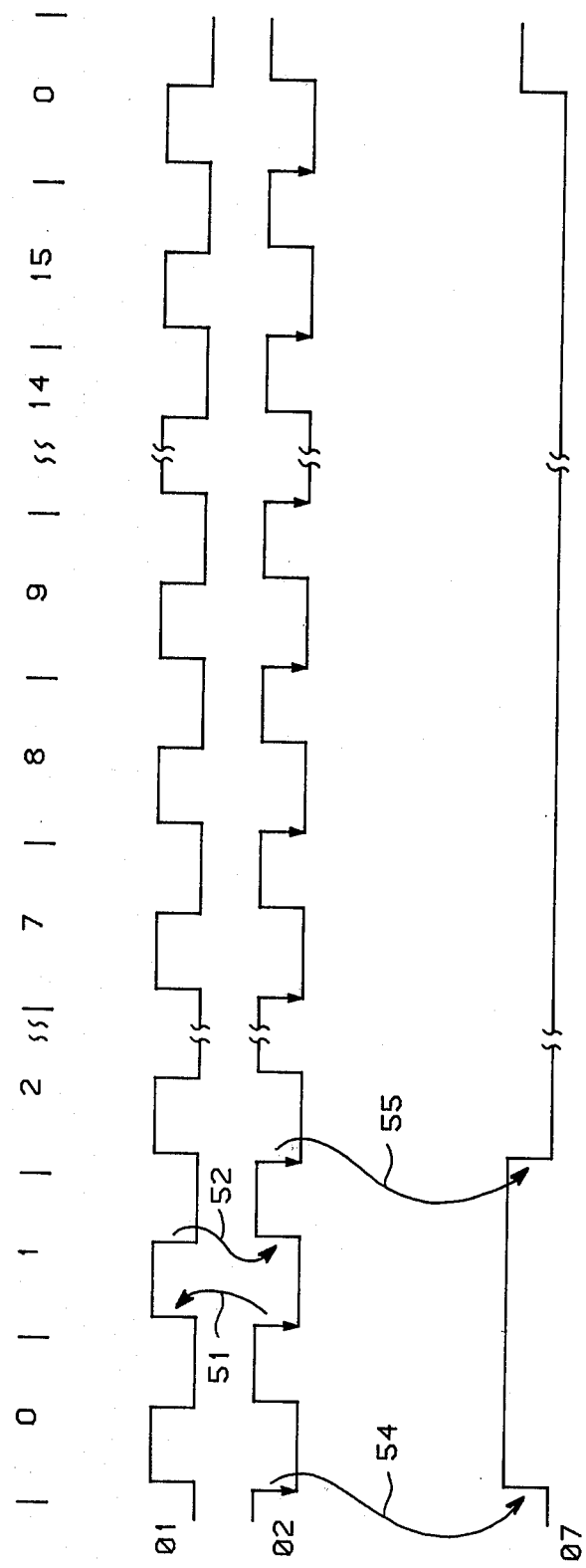
FIG. 5 illustrates some control waveforms useful in the operation of the switched capacitor filter of FIG. 4.

FIG. 5 illustrates some timing pulses that could be useful in the operation of the filter of FIG. 4. Along the top of FIG. 5 is illustrated a sampling period divided up to represent 16 time slots. Some of the time slots have been removed for simplification and are indicated by the wiggly lines. Timing signals $\phi 1$ and $\phi 2$ are useful in controlling the majority of the controllable switches in the switched capacitor filter of FIG. 4. Note how the positive portion of $\phi 1$ is narrower than the negative portion of $\phi 2$. This underlap is illustrated by arrows 51 and 52. $\phi 7$ is illustrated as being two time slots in length or one-eighth of the allowable sampling time. Note that the transitions in $\phi 7$ occur just after the high to low transitions of $\phi 2$ over a two time slot period as illustrated by arrows 54 and 55.

By now it should be appreciated that there has been provided an improved sampled data system having a sampled data filter which overcomes the (sin X)/X distortion without contributing greatly to the noise floor of the system and without impairing the dynamic range. The improved sampled data system does not have an appreciably greater group delay time than does the prior art system nor does it require additional amplifiers thereby not greatly increasing the silicon area required for the improved system.

We claim:

1. In a sampled data system which periodically samples an input signal for finite periods and provides such sampled input signal to a switched capacitor filter having an input capacitor, a circuit for correcting (sin X)/X distortion resulting from the sampling, the circuit comprising:

first switching means for selectively coupling, in response to a control signal, the sampled input signal to the input capacitor; and second switching means for selectively coupling a reference voltage to the switched capacitor filter;

wherein the capacitance of the input capacitor is selected to provide a charge gain which is inversely proportional to the duration of the selective coupling of the sampled input signal to the input capacitor.

2. The (sin X)/X correction circuit of claim 1 further comprising:

control means for receiving a control signal and for alternately enabling the first switching means and the second switching means in response to the received control signal.

3. The (sin X)/X correction circuit of claim 1 wherein the capacitance of the input capacitor is selected to provide a charge gain of eight.

4. In a sampled data system comprising:

means for correcting (sin X)/X distortion resulting from sampling an input signal for finite periods; and switched capacitor filter means having an input capacitor selectively coupled to the sampled input signal;

a method of increasing the voltage gain of the switched capacitor filter without amplifying the noise floor of the system or reducing the dynamic range of the switched capacitor filter, comprising the step of:

increasing the charge gain of the switched capacitor filter by selectively increasing the capacitance value of the input capacitor to provide a charge gain which is inversely proportional to the duration of the selective coupling of the sampled input signal to the input capacitor.

5. In a PCM codec system for periodically sampling an input signal for finite periods and providing an analog output, a circuit for correcting (sin X)/X distortion resulting from the sampling, the circuit comprising:

a switched capacitor receive filter having an input capacitor, for selectively coupling the sampled input signal to the switched capacitor receive filter;

wherein, the capacitance of the input capacitor is selected to provide a charge gain which is inversely proportional to the duration of the selective coupling of the input signal to the switched capacitor receive filter.

6. The PCM codec system of claim 5 further comprising:

first switching means for selectively coupling, in response to a control signal, the sampled input signal to the input capacitor; and second switching means for selectively coupling a reference voltage to the switched capacitor receive filter.

7. The PCM codec system of claim 6 wherein the first and second switching means are controlled by complementary signals.

8. In a codec system comprising a switched capacitor filter having an input capacitor selectively coupled to a sampled, input signal, a method for correcting (sin X)/X distortion resulting from sampling the input signal, comprising the step of:

increasing the charge gain of the switched capacitor filter by selectively increasing the capacitance value of the input capacitor to provide a charge gain which is inversely proportional to the duration of the selective coupling of the sampled input signal to the input capacitor.

* * * * *